US006637998B2

(12) United States Patent
Langan et al.

(10) Patent No.: US 6,637,998 B2
(45) Date of Patent: Oct. 28, 2003

(54) SELF EVACUATING MICRO ENVIRONMENT SYSTEM

(75) Inventors: John Giles Langan, Pleasanton, CA (US); Wayne Thomas McDermott, Fogelsville, PA (US); Thomas Hsiao-Ling Hsiung, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 180 days.

(21) Appl. No.: 09/968,125

(22) Filed: Oct. 1, 2001

(65) Prior Publication Data

US 2003/0063965 A1 Apr. 3, 2003

(51) Int. Cl.[7] ............................................. B65G 49/07
(52) U.S. Cl. ............. 414/217; 414/222.04; 414/222.07; 414/222.13; 414/939; 414/940
(58) Field of Search ........................... 414/217, 222.04, 414/222.07, 222.13, 939, 940

(56) References Cited

U.S. PATENT DOCUMENTS

| | | | |
|---|---|---|---|
| 4,668,484 A | 5/1987 | Elliott | 422/113 |
| 4,886,162 A | 12/1989 | Ambrogio | 206/328 |
| 4,943,457 A | 7/1990 | Davis et al. | 428/35.2 |
| 4,966,519 A | 10/1990 | Davis et al. | 414/786 |
| 5,255,783 A | 10/1993 | Goodman et al. | 206/334 |
| 5,346,518 A | 9/1994 | Baseman et al. | 55/267 |
| 5,351,415 A | 10/1994 | Brooks et al. | 34/389 |
| 5,644,855 A | 7/1997 | McDermott et al. | 34/516 |
| 5,810,062 A | 9/1998 | Bonora et al. | 141/351 |
| 6,277,199 B1 * | 8/2001 | Lei et al. | 118/696 |

OTHER PUBLICATIONS

"Particle Generation During Vacuum Pump Down," Y.H. Liu, et al, 37th Annual Tech. Mtg. Of Insti. Of Environ. Sciences, 1991.
"Comparative Outgassing Studies on Existing 300mm Wafer Shipping Boxes and Pods," Proceedings of ICCCS 14th Intl. Symp. . . . , 1998.
"Isolation Performance of a Wafer Transportation System Having a Continuous . . .", Proceedings, 40th Annual Tech. Mtg. Of Insti. Of Environ. Sciences, 1994.

* cited by examiner

Primary Examiner—Steven A. Bratlie
(74) Attorney, Agent, or Firm—Geoffrey L. Chase

(57) ABSTRACT

A mobile, self-evacuating, micro-environment system for transit and storage of substrates between two or more processing chambers in the manufacture of semiconductor devices is provided where the system includes a mobile cart, a vacuum sealable container to hold the substrates, a vacuum source having a portable power source, located on the cart and capable of generating a vacuum in the container, and a docking valve to mate with a corresponding valve on each of the processing chambers, where the docking valve and the corresponding valve are securable to one another to form a substantially vacuum-tight seal and openable, while mated, to permit unloading and loading of substrates between the container and the processing chamber. A method of using the system is also provided.

13 Claims, 2 Drawing Sheets

SELF EVACUATING MICRO ENVIRONMENT SYSTEM

BACKGROUND OF THE INVENTION

The present invention is directed to processing of substrates or wafers used in the manufacture of semiconductor devices. In particular, the present invention is directed to a mobile cart-based self-evacuating micro-environment system designed to transport a group of substrates in a vacuum-sealed container between processing chambers during the manufacture of semiconductor devices.

Silicon wafers having diameters up to 300 mm, and gallium arsenide wafers are used in the manufacture of semiconductor devices. Large substrates are also used in the manufacture of flat panel display devices. Many processing steps are required to fabricate devices on the surfaces of these wafers and panels (herein referred to as substrates). The steps are performed inside various tools within a fabrication building. These tools perform specialized functions, for example, layering, patterning, doping and heat treating. The partially completed devices are highly sensitive to contamination during the fabrication process. Therefore the substrates must remain in controlled environments within the tools. However, the substrates must also be transported between the various tools during fabrication. Consequently, the substrate surfaces must be protected from ambient contamination during transport. In some cases, groups of substrates are transported between tools in closed containers, or micro-environments, often referred to as standard mechanical interface (SMIF) pods. Typically, 300 mm wafers are transported in Front Opening Universal Pods (FOUPs). These containers are typically filled with clean ambient air or filtered inert gas, such as nitrogen.

The internal pressure in these transport containers is typically near the atmospheric value. Atmospheric pressure containers are convenient when interfacing with atmospheric operations such as wet processing and photolithography. However, many processing steps are conducted at reduced pressures. For example, sputter deposition is performed at pressures as low as $10^{-6}$ Torr. Substrates received from SMIF pods must therefore be placed in intermediate loadlock chambers designed to evacuate the atmosphere around the substrates prior to processing, and to return the substrates to atmospheric pressure after processing. Such cyclic evacuation and venting of loadlock chambers consumes significant quantities of energy, thereby increasing substrate processing cost. These additional steps also reduce the productivity of the tool, since no processing can occur in an individual loadlock during evacuation or venting, although tools are typically used with multiple loadlocks, wherein while one loads, the other can be processed. The present invention can eliminate the need for these multiple loadlocks.

The above productivity problem can be lessened by evacuating and venting the loadlock chamber as quickly as possible. However, rapid evacuation, accomplished through high pumping speeds, can cause excessive adiabatic cooling of the gas, leading to condensation of trace moisture in the loadlock chamber. The condensed moisture consists partially of aerosol droplets suspended in the loadlock chamber atmosphere. The resulting water droplets scavenge and react with trace contaminants in the loadlock chamber environment, thereby producing reaction products in the form of suspended residue particles. These particles can rapidly deposit on the substrate surfaces by turbulent and convective motion, or by gravitational settling. As the pressure continues to drop in the loadlock chamber, the settling speed of the particles increases, resulting in an increased rate of particle deposition on the substrates.

The above described adiabatic cooling is opposed by natural warming provided by the loadlock chamber walls. Thus, the condensation process can be prevented by pumping-down at a sufficiently low rate that heat transfer from the loadlock chamber walls prevents excessive gas cooling. B. Y. H. Liu, T. H. Kuehn and J. Zhao in "Particle Generation During Vacuum Pump Down", *Proceedings of the 37th Annual Technical Meeting of the Institute of Environmental Sciences*, San Diego, Calif., May 6–10, 1991, pp. 737–740, show that the suspended particle concentration in pumped chambers is directly related to a Z number given as:

$$Z = \tau \omega / \xi,$$

where $\tau$ is the pumping time constant, $$\tau = V/S \text{ (sec)},$$

V is the chamber volume, S is the pumping speed, and $$\xi = V/A \text{ (cm)}$$

is the chamber volume to surface area ratio. The rate of heat penetration $\omega$ from the chamber walls to the gas is given by:

$$\omega = [g\alpha/Pr]^{1/3} \text{ (cm/sec)},$$

where g is the gravitational constant, the Prandtl number Pr is given by:

$$Pr = \nu/\alpha,$$

$\nu$ is the kinematic viscosity, and $\alpha$ is the thermal diffusivity of the gas.

Experimental tests by Liu et al. (see B. Y. H. Liu, T. H. Kuehn and J. Zhao in "Particle Generation During Vacuum Pump Down", *Proceedings of the 37th Annual Technical Meeting of the Institute of Environmental Sciences*, San Diego, Calif., May 6–10, 1991) showed that higher values for Z, as produced by lower pumping speeds, resulted in lower concentrations of suspended residue particles in the gas. For example, at Z=4.17, the measured particle concentration reached ~$10^4$ per cm$^3$, while at Z=18.5, the suspended particle concentration reached only ~1 per cm$^3$. However, as stated above, low pumping speeds significantly increase processing time and thereby increase the costs associated with use of the tool. Alternatively, more rapid pumping speeds tend to produce higher concentrations of deposited residue particles on substrate surfaces, thereby significantly reducing semiconductor device yield, and increasing processing cost.

An additional significant problem encountered during the storage and transport of substrates between tools is exposure to molecular contamination released (or outgassed) particularly from the internal surfaces of plastic SMIF pods and the like. It is well known in the field of semiconductor fabrication that such molecular contaminants can produce deleterious effects on sensitive device surfaces. Such molecular contaminants tend to accumulate and increase in concentration in the pod's internal atmosphere. D. Hou, P. Sun, M. Adams, T. Hedges, and S. Govan in "Comparative Outgassing Studies on Existing 300 mm Wafer Shipping Boxes and Pods", *Proceedings of the ICCCS 14th International Symposium on Contamination Control*, Phoenix Ariz., Apr. 26–May 1, 1998, pp. 419–428, show that wafer pods can outgas significant quantities of volatile organic contamination, and that such contaminants can deposit on wafer surfaces. Test results showed that commonly used polymer additives with high boiling points were absorbed on wafer surfaces. Such contaminants tend to cause a further reduction in device yield.

Additional molecular contaminants, such as atmospheric moisture or oxygen, can cause undesired native oxide growth on substrate surfaces. Additionally, atmospheric contaminants, such as organics and metallics, reduce device performance and limit production yields. Such molecular and ionic contaminants can enter substrate containers during exposure to the atmosphere, or through minor leaks in non-hermetically sealed containers.

An additional problem encountered during the storage and transport of substrates between tools is exposure to particulate contamination generated internally by the substrates, transport mechanisms and containers. When substrates and loading/unloading machinery rub against other surfaces, microscopic particles are produced through abrasion. It is well known in the field of semiconductor fabrication that particles as small as 0.01 micrometer can produce substantial defects on modern semiconductor devices. Particles of this size can remain suspended for prolonged periods inside substrate containers. FIG. 1 shows that the settling time of such microscopic particles under atmospheric pressure (760 Torr) is very long. Only under reduced container pressure can a rapid gravitational settling of such particles occur. Under a perfect vacuum, particles enter free-fall and settle-out rapidly, regardless of size. During their prolonged periods of suspension, such particles may be readily transported onto substrate surfaces by gas turbulence and convection, or by Brownian motion phenomena within the closed container.

Previous attempts to solve the problems of molecular contaminant accumulation and particle motion in substrate containers include continuously purged containers, vapor drain systems and statically evacuated containers. The term "statically evacuated container" as used herein refers to a closed container having a hermetic seal, and holding a previously established internal vacuum, without benefit of continuous pumping.

U.S. Pat. No. 5,644,855 (McDermott et al.) discloses a portable transport container, including an attached cryogenically liquefied inert gas insulated storage vessel, from which vaporized liquefied inert gas is used to generate a continuous gaseous nitrogen purge to the container. The purge gas prevents accumulation of contamination from outgassing or minor atmospheric leaks.

U.S. Pat. No. 4,668,484 (Elliott) discloses a portable transport container, including an attached compressed gas cylinder mounted above the wafer container, from which inert gas is used to generate a continuous gaseous nitrogen purge to the container.

A similar purged container for silicon wafers was described by T. Yabune, T. Futatsuki, K. Yamada, and T. Ohmi in "Isolation Performance of a Wafer Transportation System Having a Continuous $N_2$ Gas Purge Function", *Proceedings, 40th Annual Technical Meeting of the Institute of Environmental Sciences*, Chicago, Ill., May 1–6, 1994, pp. 419–424. The Yabune et al. container also uses an attached mini cylinder of pressurized nitrogen to purge the wafer container. The Yabune, et al. system uses an aluminum container and a high purity, all-metal gas distribution system.

U.S. Pat. No. 5,351,415 (Brooks et al.) discloses a container for storage or transport of semiconductor wafers that uses a purge of ionized gas, such as gaseous nitrogen. The nitrogen is supplied from a cylinder of compressed gas that is typical in the industry. The compressed gas cylinder is not affixed directly to the container, but is connected through a gas line.

U.S. Pat. No. 5,346,518 (Baseman et al.) discloses a vapor drain system, consisting of an activated carbon or other suitable vapor removal element located inside the sealed substrate container. This vapor drain reduces the accumulation of vapors emitted inside the container using a continuous scavenging process.

Continuously purged containers and vapor drain systems, such as those described above, reduce the accumulation of outgassed molecular contamination. However, purged containers vent their purge gas into the surrounding atmosphere, and, therefore, must be held at internal pressures near or above the atmospheric value. Additionally, vapor drain systems have only been developed for containers held at near atmospheric pressure. Therefore, the problems described above regarding evacuation and venting of load-lock chambers cannot be solved by using such methods.

U.S. Pat. No. 4,966,519 (Davis et al.) and U.S. Pat. No. 4,943,457 (Davis et al.) disclose vacuum tight wafer containers, held at less than $10^{-5}$ Torr internal pressure, and a loadlock chamber suitable for use with the wafer container. The container is evacuated and hermetically sealed at a processing station, and the wafers are then transported to the next station or stored under a static hard vacuum within the container. The evacuated interior of the container eliminates gas movement and Brownian motion, while inducing rapid particle settling. Particulate contamination of wafer surfaces within the containers is therefore reduced.

U.S. Pat. No. 5,255,783 (Goodman et al.) discloses a container and a method of storing semiconductor wafers under static vacuum. The container includes a valve designed to remove the internal atmosphere subsequent to loading wafers into the container. The valve is then closed to provide a hermetic seal to the container. The same valve is then used to re-pressurize the container at the destination site prior to unloading the wafers.

U.S. Pat. No. 5,810,062 (Bonora et al.) discloses a SMIF pod-type wafer container having a valve designed to permit gas flow into or out of the pod. The pod design permits wafers to be transported between processing stations under static vacuum.

U.S. Pat. No. 4,886,162 (Ambrogio) discloses a single-wafer container that can be packaged in a statically evacuated plastic wrapper. The hermetic seal packaging prevents moisture and other atmospheric contaminants from entering the container during extended periods of storage or transport.

Containers having static vacuums, such as those described above, minimize exposure of substrates to particulate contamination, but do not prevent accumulation of outgassed molecular contamination or atmospheric contamination entering through minor leaks. A further disadvantage of hermetically sealed containers is that any required evacuation or venting of the container must be performed at a substrate processing station, or special pumping/venting station, thereby reducing process productivity as described above.

BRIEF SUMMARY OF THE INVENTION

A mobile, self-evacuating, micro-environment system for transit and storage of substrates between two or more processing chambers in the manufacture of semiconductor devices is provided. The system includes a mobile cart and a vacuum sealable container having an internal volume to hold a plurality of the substrates. The container is located on the cart. A vacuum source having a portable power source is located on the cart which is capable of generating a vacuum in the internal volume of the container. A docking valve is included to mate with a corresponding valve on each of the processing chambers. The docking valve and the corresponding valve are securable to one another to form a substantially vacuum-tight seal and openable, while mated, to permit unloading and loading of substrates between the container and the processing chamber. The docking valve provides a seal for the container when the container is detached from any of the processing chambers.

The vacuum source preferably includes at least one sorption pump, for example, a cryogenic molecular sieve sorption pump operable solely by liquid nitrogen.

The sorption pump is preferably capable of pumping down the container to a base pressure of about $10^{-2}$ Torr. The vacuum source is preferably controlled using a selected pumping rate and vacuum conductance by adjustable valves to eliminate impurities condensation and residue particle formation. The vacuum source may additionally include one or more ion pump or turbo-molecular pump, which is preferably operated by battery power and controlled by a battery powered controller. The ion or turbo-molecular pump can preferably achieve a pressure of about $10^{-6}$ to $10^{-9}$ Torr and provides continuous removal of trace molecular contaminants. The vacuum source preferably provides continuous, active pumping of the container with power connection only to the portable power source to remove substantially any molecular contaminants that may outgas from the internal surfaces of the container or enter the container through minor leaks and preferably is capable of creating a vacuum sufficient to eliminate particle motion inside the container caused by gas movement and Brownian motion. The vacuum source also preferably provides continuous pumping of the containers, to provide continuous removal of released surface moisture and other contaminants that may be subsequently transferred into the processing chambers. Finally, in the preferred embodiment, the vacuum source gradually and controllably adjusts the internal pressure of the container during transit of the system from a first one of the processing chambers to a second one of the processing chambers such that the internal pressure of the container matches that of the second one of the processing chambers and minimizes particle motion to prevent accumulation of molecular contaminants within the container.

The mobile, self-evacuating, micro-environment system also evacuates the small space between the docking valve and the processing chamber which is at 1 atmosphere.

A method for transit and storage of substrates between two or more processing chambers in the manufacturing of semiconductor devices is also provided which includes the steps of providing the above system, processing the substrates in a first one of the processing chambers, mating the docking valve with the corresponding valve on the first one of the processing chambers, activating the vacuum source to the container to equalize pressure of the container with the one of the processing chamber, opening the docking valve and the corresponding valve while the chambers are sealed to one another to provide access between the container and the one of the processing chambers, moving the substrates from the one of the processing chambers to the container, closing the docking valve to seal the container, controlling the vacuum source to slowly change pressure in the container to that of a second one of the processing chambers, and mating the docking valve with the corresponding valve on the second one of the processing chambers.

DETAILED DESCRIPTION OF THE INVENTION

The present invention is intended to provide protection against ambient contamination for various substrates, including wafers made from, for example, silicon, gallium arsenide and other semiconductor materials, and flat panel display devices, thus increasing their yield rate during fabrication. This protection is provided as the substrates are held in storage between processing steps or transported between processing tools during fabrication. The invention is further intended to minimize the exposure of semiconductor substrates to molecular contamination released (or outgassed) from the internal surfaces of substrate storage and transport containers, and from particulate contamination generated from substrates, transport mechanisms and containers. The invention is further intended to minimize the time required to load/unload substrates as they enter or exit semiconductor processing tools, thus saving valuable processing time, and improving the cost of ownership for tools. This savings in time is achieved by eliminating the pump-down and vent (re-pressurization) steps normally performed in a tool loadlock chamber.

The above productivity problems caused by evacuation and venting of loadlock chambers can be eliminated by pumping-down and venting the substrate container's atmosphere while it is in transport (or storage) between loadlock chambers. The method of the present invention permits evacuation and venting of the container at a controlled, slower rate that does not promote internal condensation and aerosol formation. Furthermore, the method of the present invention allows the wafers to arrive at the processing tool's loadlock chamber already under vacuum, and ready for processing. Also, the problems related to particle motion, and accumulation of contaminants through outgassing and minor leakage, can be eliminated by continuous pumping (also referred to as active evacuation) of the vessel during use.

Figure 1:
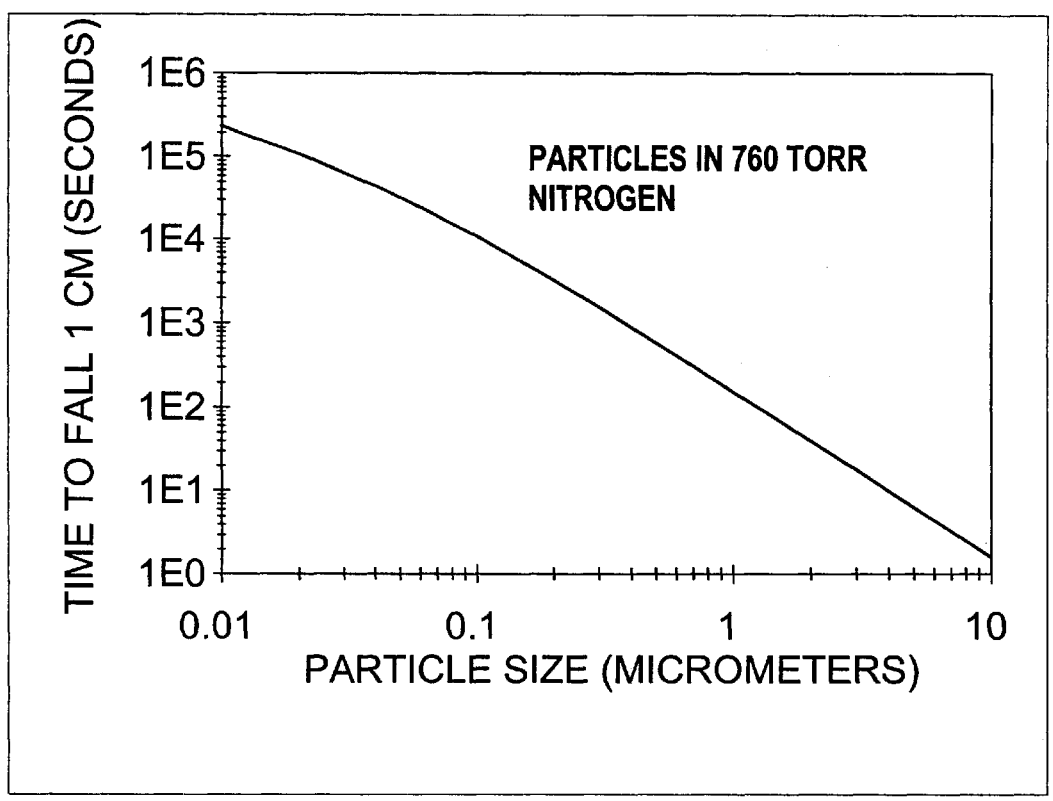
FIG. 1 is a graphical depiction of settling time of microscopic particles sized from 0.01 micrometers to 10 micrometers, caused by, e.g., abrasion of two surfaces, in a 760 Torr (atmospheric pressure) environment.
Figure 2:
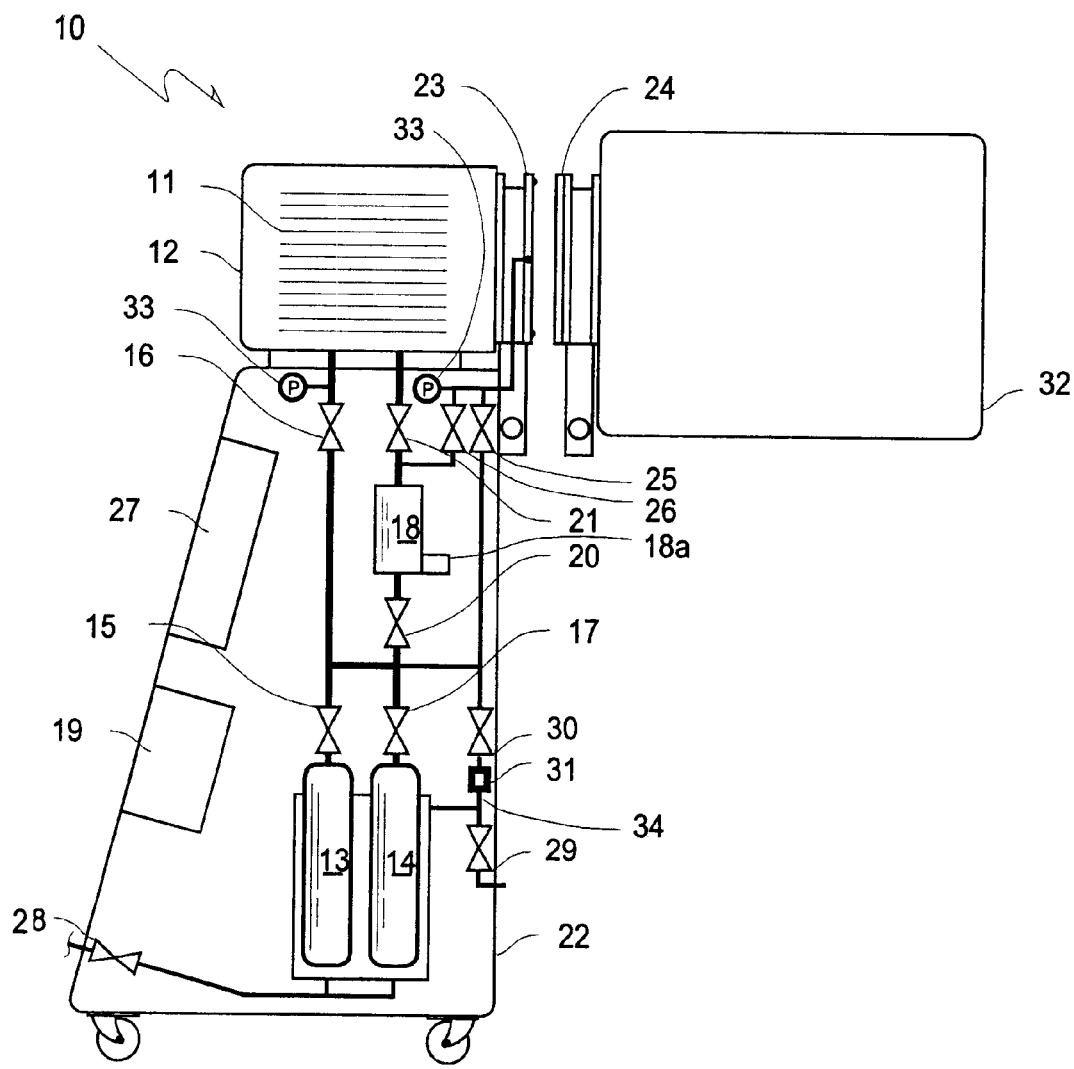
FIG. 2 is a mobile cart-based self-evacuating micro-environment system in accordance with one preferred embodiment of the present invention.

Referring now to the drawings, there is seen in FIG. 2, a mobile cart-based self-evacuating micro-environment (SEME) system 10 in accordance with one preferred embodiment of the present invention. The SEME system 10 is designed to perform this controlled, active evacuation and venting. The SEME system 10 transports a group of wafers 11 in a vacuum-sealed container 12. Cryogenic molecular sieve sorption pumps 13 and 14, located on the cart, generate a clean vacuum in the container 12. Such sorption pumps 13, 14 require only liquid nitrogen to operate. Sorption pump 13 performs an initial pump-down of the container when valves 15 and 16 are opened. Sorption pump 14 then pumps the container to a base pressure of about $10^{-2}$ Torr when valves 17 and 16 are opened. This pressure is low enough to allow immediate transfer of the wafers 11 into many processing tools without further pump-down.

The pumping speed for the container 12 during pump-down is set using a selected pumping rate and vacuum conductance in the system. The vacuum conductance in the system 10 can be set using adjustable gate valves and other such devices (not shown in FIG. 2) well known in the field of vacuum science. The pumping speed during pump-down is set to eliminate impurities condensation and residue particle formation as described in the Background of the Invention above. The ultimate pressure in the container following pump-down can be matched to the requirements of the destination tool, thereby permitting immediate loading of wafers 11 into an evacuated processing chamber. The ultimate pressure requirements typically depend upon the permissible amounts of surface contamination. For instance, at $10^{-6}$ Torr, one monolayer of contaminants can land on a wafer in one second, while at $10^{-9}$ Torr, it takes 1000 seconds to accumulate one monolayer of contaminants.

The SEME container 12 can be subsequently pumped to pressures lower than $10^{-2}$ Torr. Lower pressures can be achieved in the container 12 using an ion pump or turbo-molecular pump 18 backed by one or more sorption pump. This ion or turbo-molecular pump 18 is preferably operated by a battery powered controller 19. The ion or turbo-molecular pump 18 evacuates the container 12 when valves 17, 20 and 21 are opened. Typical turbo-molecular pumps 18 can pump at a rate of 40 liters per second while achieving pressures of about $10^{-6}$ to $10^{-9}$ Torr. Such pumps can operate using, for example, 24 Volt batteries 18a, and consume, for example, only 20 Watts of power after initial pump-down. This pumping of the container 12 to high vacuum provides continuous removal of trace molecular contaminants and allows immediate interfacing with high vacuum processing tools.

The system 10 is contained in a mobile cart 22. The combination of sorption and ion, or turbo-molecular, pumps provides continuous, active pumping of the wafer container with no connection to external power. This continuous pumping removes any molecular contaminants that may outgas from the internal surfaces of the container 12 or enter the container 12 through minor leaks. The low pressures produced by the system 10 also eliminate particle motion inside the container 12 caused by gas movement and Brownian motion.

In the preferred embodiment, the mobile cart 22 is equipped with linear motion drive and a gate-type docking valve 23 designed to mate with a corresponding valve 24 on a robot chamber or processing tool 32. During the docking process, the two valves are securely clamped together, forming a vacuum-tight seal. The small space located between the gate valves 23, 24 is then evacuated by the SEME system 10 pumps. The initial pump-down of this space is accomplished by opening valves 15 and 25 to sorption pump 13. The final (high vacuum) pump-down of the space is accomplished by opening valves 17, 20 and 26 to the ion or turbo-molecular pump 18. The two gate valves 23, 24 are then opened to permit unloading/loading of wafers to the robot chamber or processing tool 32.

Pressure gauges 33 are monitored by an on-board computer 27. The computer 27 automatically controls the sequencing of the valves and pumps, and the regeneration of the sorption pumps 13, 14, while displaying the status of the system.

The sorption pumps 13, 14 are charged with liquid nitrogen by opening valve 28. The boiled-off gaseous nitrogen can be continuously vented through external vent valve 29. Alternatively, the boiled-off gaseous nitrogen can be used as a pure, inert gas to re-pressurize (vent) the SEME container 12 or inter-gate valve space when necessary. This re-pressurization can be accomplished by closing the external vent valve 29, and opening the internal vent valve 30, along with valves 16 or 25. Preferably, a purifier/filter unit 31 is located in an internal vent line 34 to further reduce contamination in the gaseous nitrogen.

A pure cylinder gas, stored onboard, or filtered ambient air can also be used to vent the container or the inter-gate valve space.

The container 12 can be re-pressurized at a controlled, slow rate while the SEME system 10 is in transport, without affecting the productivity of the processing tools 32. Such controlled venting can be used to reduce the rate of particle re-suspension, shear-off, or "shedding", well known to occur during high velocity or turbulent gas flow. The result is a lower concentration of suspended particulate contamination in the re-pressurized container 12. The flow rate of gaseous nitrogen during internal venting is controlled by setting the flow resistance of the internal vent line. Flow resistance in the system 10 can be set using in-line orifices, metering valves, flow controllers, and other such devices (not shown) well known in the field of gas flow.

The boiled-off gaseous nitrogen released by the sorption pumps 13, 14 can also be used under moderate pressure to operate pneumatically actuated valves in the SEME system 10, or to operate a small gas turbine/generator (not shown). The generator would recharge the onboard battery 18a used to operate the ion or turbomolecular pump 18. When not in transit between processing stations, the SEME system 10 can be connected to a gaseous nitrogen vent line, an electrical power source to recharge the battery 18a, and a liquid nitrogen source to recharge the sorption pumps.

A current trend in semiconductor fabrication is process sequence integration, where a sequence of processing steps such as plasma-enhanced chemical vapor deposition, etching, polishing, and physical vapor deposition from one tool vendor are guaranteed to produce a stack of thin films for device manufacturing. The SEME system 10 improves the throughput of this sequence by moving the wafers between processing tools 32 under vacuum, and without intermediate re-pressurization, thus allowing the tool 32 set to be considered as one virtual cluster tool. Operation in this way also reduces energy consumption associated with pressure cycling in loadlock chambers. Most tools can be configured to accept two SEME systems 10 simultaneously. If a vacuum process follows a photolithography step or wet processing step (performed at atmospheric pressure), the SEME system 10 permits controlled evacuation of the wafer container 12 as it moves through the fabrication area.

Continuous pumping of semiconductor substrate containers 12, as performed by the SEME system 10, provides continuous removal of released surface moisture and other contaminants that may be subsequently transferred into the tools. Such surface contaminants, which are slowly released from containers or substrates, are especially important in large area substrates, such as thin-film transistor flat panel displays. The SEME system 10 provides continuous pumping of wafer containers 12 to assist in removal of these contaminants without loss of processing time.

Previous methods for storing and transporting semiconductor substrates have attempted to control particle motion or accumulation of molecular contaminants within portable containers using static vacuum, continuous purge flow, or vapor drains. However, previous methods have not included capabilities for on-board, active vacuum pumping or controlled re-pressurization.

Consequently, previous methods cannot gradually and controllably adjust the internal pressure of the mobile container during transit to match that of the next processing station, while at the same time minimizing particle motion and preventing the gradual accumulation of molecular contaminants within the container.

Furthermore, previous methods cannot improve the productivity of substrate processing tools through elimination of the loadlock chamber pressure cycling step. The SEME system 10 accomplishes this productivity improvement by performing the pressure cycling during transit.

The SEME system can be essentially operated with liquid cryogenic nitrogen and uses low vibration vacuum pumps, such as sorption pumps or ion pumps. Such low vibration systems tend to release a minimum amount of particulate contamination onto substrate surfaces.

Although illustrated and described herein with reference to specific embodiments, the present invention nevertheless is not intended to be limited to the details shown. Rather, various modifications may be made in the details within the scope and range of equivalents of the claims without departing from the spirit of the invention.

What is claimed is:

1. A mobile, self-evacuating, micro-environment system for transit and storage of substrates between two or more processing chambers in the manufacture of semiconductor devices, said system comprising:
   (a) a mobile cart;
   (b) a vacuum sealable container, said container having an internal volume adapted to hold a plurality of said substrates, said container located on said cart;
   (c) a vacuum source having a portable power source, said vacuum source and said power source located on said cart, said vacuum source capable of generating a vacuum in said internal volume of said container; and
   (d) a docking valve to mate with a corresponding valve on each of said processing chambers, said docking valve and said corresponding valve securable to one another to form a substantially vacuum-tight seal and openable, while mated, to permit unloading and loading of substrates between said container and said processing chamber, said docking valve providing a seal for said container when said container is detached from any of said processing chambers;
   whereby protection against ambient contamination of said substrates is provided.

2. The self-evacuating micro-environment system of claim 1, wherein said vacuum source comprises at least one sorption pump.

3. The self-evacuating micro-environment system of claim 2, wherein said at least one sorption pump is a cryogenic molecular sieve sorption pump operable solely by liquid nitrogen.

4. The self-evacuating micro-environment system of claim 2, wherein said sorption pump is capable of pumping down the container to a base pressure of about $10^{-2}$ Torr.

5. The self-evacuating micro-environment system of claim 1, wherein the vacuum source is controlled using a selected pumping rate and vacuum conductance by adjustable valves to eliminate impurities condensation and residue particle formation.

6. The self-evacuating micro-environment system of claim 1, wherein said vacuum source additionally comprises at least one pump selected from the group of ion pumps and turbo-molecular pumps.

7. The self-evacuating micro-environment system of claim 6, wherein said pump selected from the group of ion pumps and turbo-molecular pumps is operated by battery power and is controlled by a battery powered controller.

8. The self-evacuating micro-environment system of claim 7, wherein said pump selected from the group of ion pumps and turbo-molecular pumps can achieve a pressure of about $10^{-6}$ to $10^{-9}$ Torr and provides continuous removal of trace molecular contaminants.

9. The self-evacuating micro-environment system of claim 1, wherein said vacuum source is adapted to provide continuous, active pumping of said container with power connection only to said portable power source to remove substantially any molecular contaminants that may outgas from the internal surfaces of the container or enter the container through minor leaks.

10. The self-evacuating micro-environment system of claim 1, wherein said vacuum source is capable of creating a vacuum sufficient to eliminate particle motion inside the container caused by gas movement and Brownian motion.

11. The self-evacuating micro-environment system of claim 1, wherein said vacuum source is adapted to provide continuous pumping of said container, to provide continuous removal of released surface moisture and other contaminants that may be subsequently transferred into said processing chambers.

12. The self-evacuating micro-environment system of claim 1, wherein said vacuum source is adapted to gradually and controllably adjust the internal pressure of said container during transit of said system from a first one of said processing chambers to a second one of said processing chambers such that said internal pressure of said container matches that of said second one of said processing chambers and minimizes particle motion to prevent accumulation of molecular contaminants within said container.

13. A method for transit and storage of substrates between two or more processing chambers in the manufacturing of semiconductor devices, comprising the steps of
   (a) providing a mobile cart;
   (b) providing a vacuum sealable container, said container having an internal volume adapted to hold a plurality of said substrates, said container located on said cart;
   (c) providing a vacuum source having a portable power source, said vacuum source and said power source located on said cart, said vacuum source capable of generating a vacuum in said internal volume of said container;
   (d) providing a docking valve to mate with a corresponding valve on each of said processing chambers, said docking valve and said corresponding valve securable to one another to form a substantially vacuum-tight seal and openable, while mated, to permit unloading and loading of substrates between said container and said processing chamber, said docking valve providing a seal for said container when said container is detached from any of said processing chambers;
   (e) processing said substrates in a first one of said processing chambers;
   (f) mating said docking valve with said corresponding valve on said first one of said processing chambers;
   (g) activating said vacuum source to said container to equalize pressure of said container with said one of said processing chamber;
   (h) opening said docking valve and said corresponding valve, while said chambers are mated to one another, to provide access between said container and said one of said processing chambers;
   (i) moving said substrates from said one of said processing chambers to said container;
   (j) closing said docking valve to seal said container;
   (k) controlling said vacuum source to slowly change pressure in said container to that of a second one of said processing chambers; and
   (l) mating said docking valve with said corresponding valve on said second one of said processing chambers;
   whereby protection against ambient contamination for said substrates is provided.

* * * * *